United States Patent
Loo et al.

(10) Patent No.: US 7,772,646 B2
(45) Date of Patent: Aug. 10, 2010

(54) METHOD OF MANUFACTURING A SEMICONDUCTOR DEVICE AND SUCH A SEMICONDUCTOR DEVICE

(75) Inventors: Josine Johanna Gerarda Petra Loo, Leuven (BE); Vincent Charles Venezia, Belgium (BE); Youri Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 161 days.

(21) Appl. No.: 11/574,338

(22) PCT Filed: Aug. 10, 2005

(86) PCT No.: PCT/IB2005/052653
§ 371 (c)(1),
(2), (4) Date: Mar. 6, 2009

(87) PCT Pub. No.: WO2006/024978
PCT Pub. Date: Mar. 9, 2006

(65) Prior Publication Data
US 2009/0166799 A1    Jul. 2, 2009

(30) Foreign Application Priority Data
Sep. 2, 2004   (EP)   ................... 04104204

(51) Int. Cl.
*H01L 29/78* (2006.01)
*H01L 21/84* (2006.01)

(52) U.S. Cl. ............ 257/348; 257/396; 257/402; 257/E21.568; 257/E27.112; 438/151; 438/275; 438/406; 438/407; 438/766; 438/981

(58) Field of Classification Search ........... 438/275, 438/406–407, 766, 981, 151; 257/348, 396, 257/402, E21.568, E27.112
See application file for complete search history.

(56) References Cited

U.S. PATENT DOCUMENTS

| 5,895,252 A  * | 4/1999 | Lur et al. ............ 438/423 |
| 6,664,146 B1 * | 12/2003 | Yu ..................... 438/149 |
| 2004/0150067 A1* | 8/2004 | Ghyselen et al. ...... 257/506 |

* cited by examiner

*Primary Examiner*—Mary Wilczewski
*Assistant Examiner*—Toniae M Thomas

(57) ABSTRACT

There is a method of manufacturing a semiconductor device with a semiconductor body comprising a semiconductor substrate and a semiconductor region which are separated from each other with an electrically insulating layer which includes a first and a second sub-layer which, viewed in projection, are adjacent to one another, wherein the first sub-layer has a smaller thickness than the second sub-layer, and wherein, in a first sub-region of the semiconductor region lying above the first sub-layer, at least one digital semiconductor element is formed and, in a second sub-region of the semiconductor region lying above the second sub-layer, at least one analog semiconductor element is formed.

Figure 1:
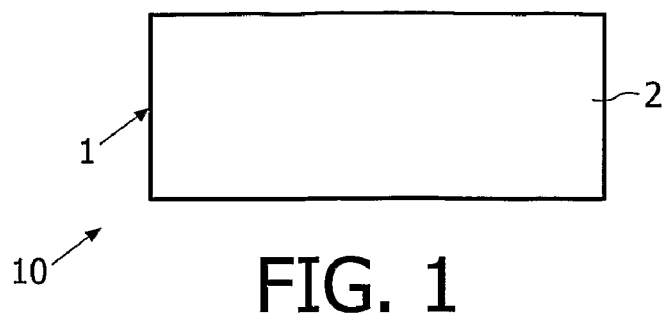

According to an example embodiment, the second sub-layer is formed in that the lower border thereof is recessed in the semiconductor body in relation to the lower border of the first sub-layer Fully depleted SOI devices are thus formed.

10 Claims, 4 Drawing Sheets

METHOD OF MANUFACTURING A SEMICONDUCTOR DEVICE AND SUCH A SEMICONDUCTOR DEVICE

The invention relates to a method of manufacturing a semiconductor device with a semiconductor body comprising a semiconductor substrate and a semiconductor region, which are separated from each other by means of an electrically insulating layer, which comprises a first and a second sub-layer, which are adjacent when viewed in projection, wherein the first sub-layer has a smaller thickness than the second sub-layer, and wherein, in a first sub-region of the semiconductor region situated above the first sub-layer, at least one digital semiconductor element is formed and, in a second sub-region of the semiconductor region situated above the second sub-layer, at least one analog semiconductor element is formed.

The invention also relates to such a semiconductor device.

Such a method can very suitably be used for, inter alia, the manufacture of, for example, semiconductor devices comprising integrated digital and analog circuits in, respectively, the first and the second part of the semiconductor region. For the operation of elements in an analog circuit often a higher voltage is required than for the operation of digital elements. Breakdown to the substrate can be precluded by the thicker insulating layer at the location of the analog elements. The use of an insulating layer at the location of digital elements requires a smaller thickness of said layer to preclude breakdown. The use of a smaller thickness at said location in addition has various advantages.

A method of the type mentioned in the opening paragraph is known from United States patent specification U.S. Pat. No. 6,548,369, published on 15 Apr. 2003 under said number. Said document describes how an insulating layer is formed in a silicon semiconductor body comprising a silicon substrate by means of implantation of oxygen ions in said silicon substrate, which insulating layer separates a—thin—semiconductor region adjacent to the surface of the semiconductor body from the underlying part of the semiconductor body. By carrying out different oxygen implantation processes in which part of the surface is masked, it is achieved that locally a thicker oxide layer is formed while at other locations a thinner oxide layer is formed.

Above the thinner oxide layer the semiconductor region has a larger thickness and above the thicker oxide layer the semiconductor region has a smaller thickness. In the first-mentioned part of the semiconductor region, i.e. above the thinner oxide layer, a digital semiconductor element is formed, and above the last-mentioned part of the semiconductor region an analog semiconductor element is formed. As a result of the difference in thickness, the digital element does not operate in the fully depleted mode, unlike the analog element, which does operate in said mode. As a result of the SOI (=Silicon-On-Insulator) character of the method, all elements are electrically separated from the part of the substrate lying under the insulating layer, as a result of which undesirable phenomena such as crosstalk and unintentional voltage supply from the lower side of the device can be precluded. Mutual isolation of the various (groups of) semiconductor elements can be achieved using, for example, a so-termed STI (=Shallow Trench Isolation).

A drawback of the known method resides in that the device obtained is less suitable for the manufacture of FD (=Fully Depleted) circuits, that is to say, circuits in which also the digital element operates in the fully depleted mode.

Therefore, it is an object of the present invention to provide a method of the type mentioned in the opening paragraph, which is suitable for the manufacture of FD-SOI devices and which is both simple and inexpensive.

To achieve this, a method of the type mentioned in the opening paragraph is characterized in accordance with the invention in that the second sub-layer is formed in such a manner that the lower border thereof is recessed in the semiconductor body in relation to the lower border of the first sub-layer.

The invention is based first of all on the recognition that a recessed lower border of the second sub-layer enables, at an equal difference in thickness between the two sub-layers, the difference in thickness between the two superjacent sub-semiconductor regions to be reduced. By virtue thereof, both the digital and the analog element can be manufactured more readily in the fully depleted mode. The invention is also based on the recognition that such a method can be readily realized by using local thermal oxidation to form the sub-layers and by using a substrate transfer technique to form the semiconductor region. All of the above will be explained in greater detail hereinbelow by means of the description of important preferred embodiments of a method in accordance with the invention.

An important additional advantage of, in particular, these preferred embodiments, which will be described hereinbelow, resides in that they allow the first, i.e. thinnest, sub-layer to be made very thin. This can be used to advantage in the digital element, because such a thin first sub-layer makes it possible for the first sub-layer to form the gate dielectric of a MOS transistor with two, oppositely located, gate electrodes.

In a first preferred embodiment of a method in accordance with the invention, the upper border of the first sub-layer in the semiconductor body is formed at the same level as the upper border of the second sub-layer. This is made possible by the use of a substrate-transfer technique, in which use is made of chemical-mechanical polishing. This will be explained in the description of the exemplary embodiments. An advantage of this embodiment resides in that the first and the second sub-semiconductor region can be formed so as to have the same thickness, which facilitates the realization of a fully depleted mode in both sub-regions.

If, however, unequal thicknesses of the semiconductor sub-regions are desired, then part of the semiconductor region may be locally removed, for example by means of a local thermal oxidation. A drawback thereof may be that the surface of the semiconductor body will eventually be less flat.

In an important preferred embodiment, the first and the second sub-layer are formed at the surface of the semiconductor substrate, and the semiconductor region is provided thereon by means of a substrate-transfer technique. The particular advantages thereof, as already described hereinabove, will be described in greater detail hereinbelow.

In a further preferred embodiment, the first and the second sub-layer are formed by thermal oxidation of the surface of the semiconductor substrate, and thickness-regulating means are locally applied, causing the oxide thickness at the location of the first sub-layer to be formed to be smaller than at the location of the second sub-layer to be formed, and, after the thermal oxidation process, the surface of the semiconductor body is planarized by means of chemical-mechanical polishing, after which the semiconductor region is provided thereon by means of the substrate-transfer technique. By virtue thereof, the object of the present invention is achieved in a simple manner.

In a first modification thereof, the use of the thickness-regulating means comprises the application, at the location of the first sub-layer, of a mask which delays the oxidation process. Such a mask can be made, for example, of silicon nitride which can be readily provided and patterned by means of photolithography and etching. Consequently, in this modification, the thermal oxidation is locally delayed or even precluded.

In a further modification, the use of the thickness-regulating means comprises providing the oxidation-accelerating impurities in the semiconductor substrate at the location of the second sub-layer. This modification forms, as it were, a complementary technique to the previous modification, and the final result, i.e. a difference in thickness between both sub-layers, is the same.

In a further embodiment, the semiconductor region is formed by treating a surface region of a further semiconductor substrate by means of hydrogen and helium, and, after the transfer of the further semiconductor substrate, whereby the surface region is provided on the planarized semiconductor substrate, the remaining part of the further semiconductor substrate is removed by means of a splitting technique.

The substrate-transfer technique may also comprise the use of a so-termed BOX (=Buried Oxide) further semiconductor substrate, in which case the part of the further semiconductor substrate situated below the buried oxide layer can be removed by means of (selective or non-selective) etching or chemical-mechanical polishing, or a combination of both techniques, after which the BOX oxide can be removed by (preferably selective) etching. The splitting technique mentioned in the previous modification has the advantage that it combines greater speed with a substantially reduced use of chemicals.

A semiconductor device with a semiconductor body comprising a semiconductor substrate and a semiconductor region, which are separated from each other by means of an electrically insulating layer, which comprises a first and a second sub-layer which, viewed in projection, are adjoining layers, wherein the first sub-layer has a smaller thickness than the second sub-layer, and wherein, in a first sub-region of the semiconductor region situated above the first sub-layer, at least one digital semiconductor element is formed and, in a second sub-region of the semiconductor region situated above the second sub-layer, at least one analog semiconductor element is formed, is characterized according to the invention in that the second sub-layer is formed in such a manner that the lower border thereof is recessed in the semiconductor body in relation to the lower border of the first sub-layer. This device offers the advantages already described hereinabove.

In a preferred embodiment of a semiconductor device in accordance with the invention, the upper border of the first sub-layer is formed at the same level in the semiconductor body as the upper border of the second sub-layer.

Preferably, the thickness of the semiconductor region at the location of the first and the second sub-layer is approximately the same, the thickness being so small that the semiconductor element operate in the so-termed fully depleted mode.

These and other aspects of the invention are apparent from and will be elucidated with reference to the embodiment(s) described hereinafter.

Figure 2:
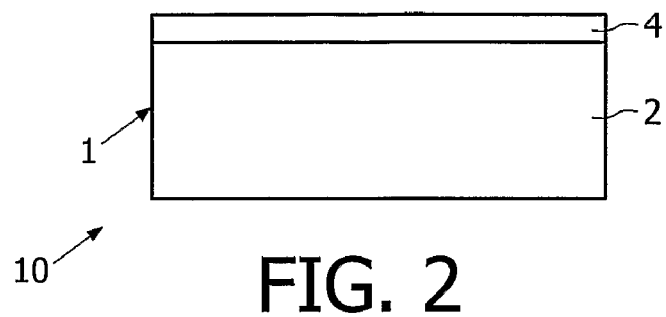
Figure 3:
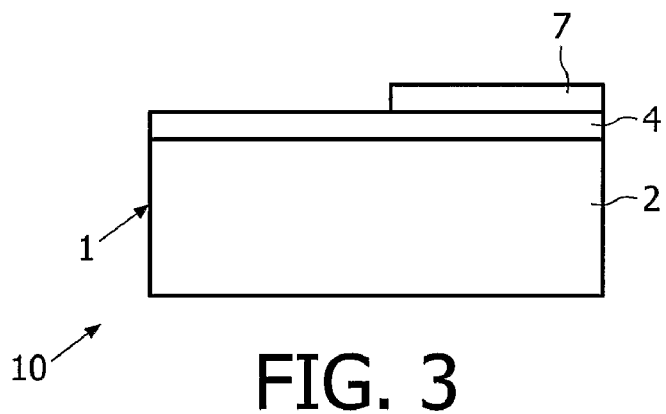
Figure 4:
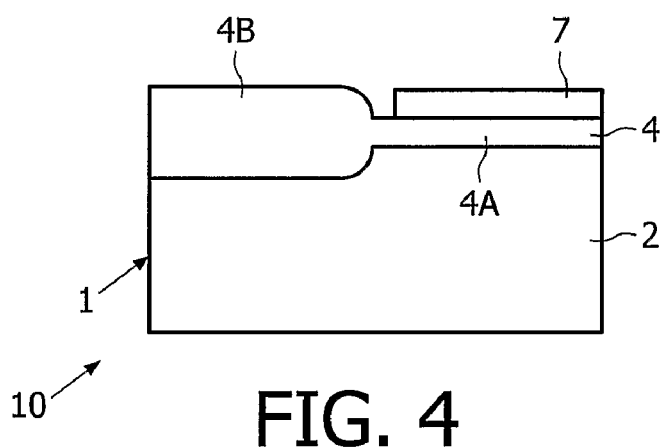
Figure 5:
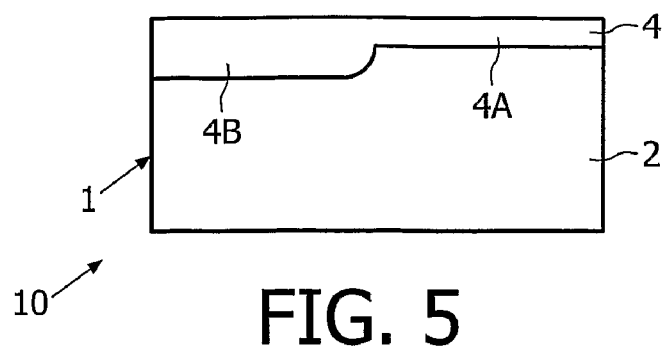
Figure 6:
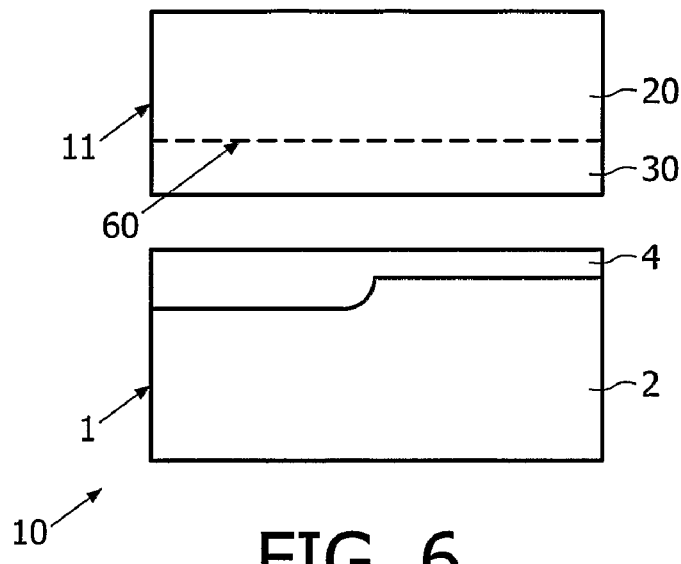
Figure 7:
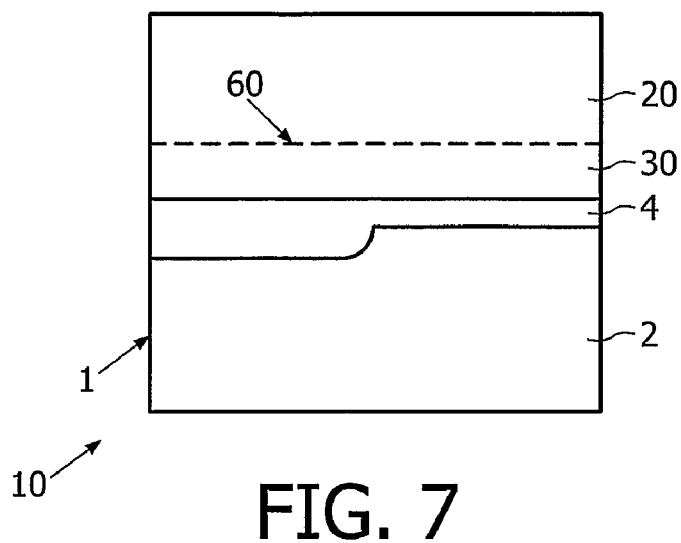
Figure 8:
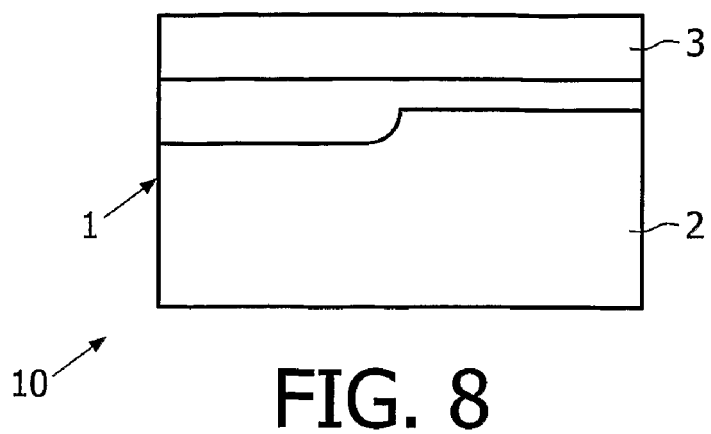
Figure 9:
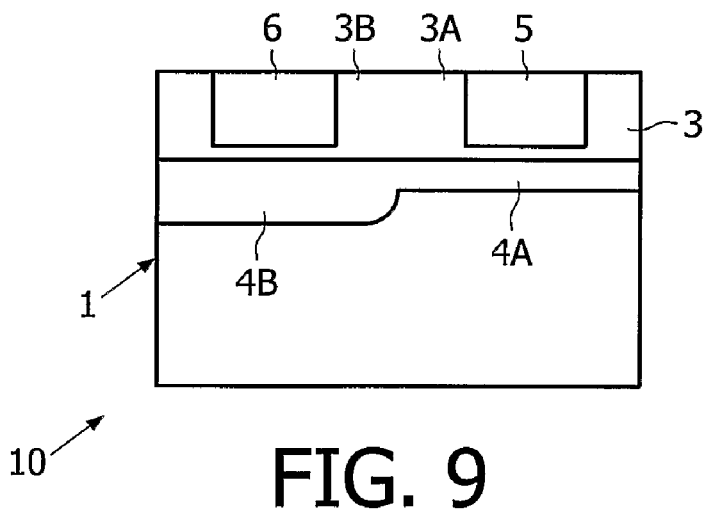
Figure 10:
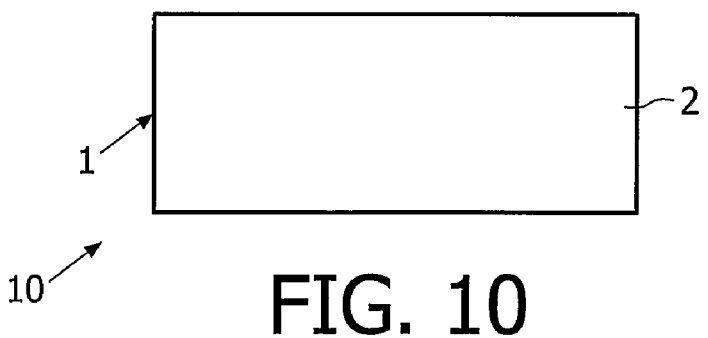
Figure 11:
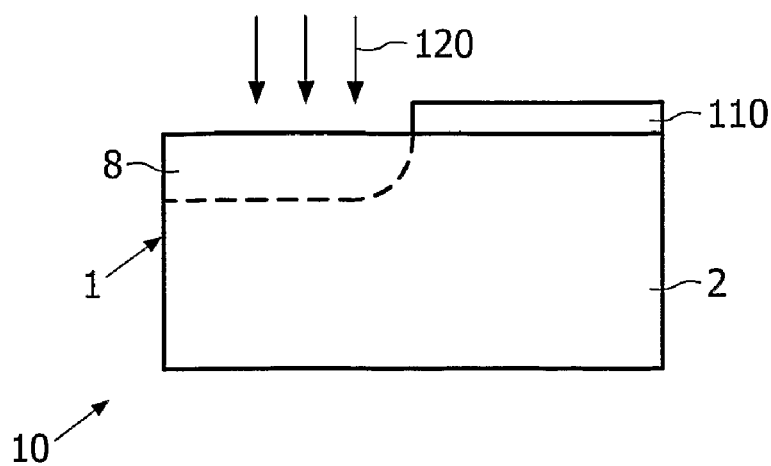
Figure 12:
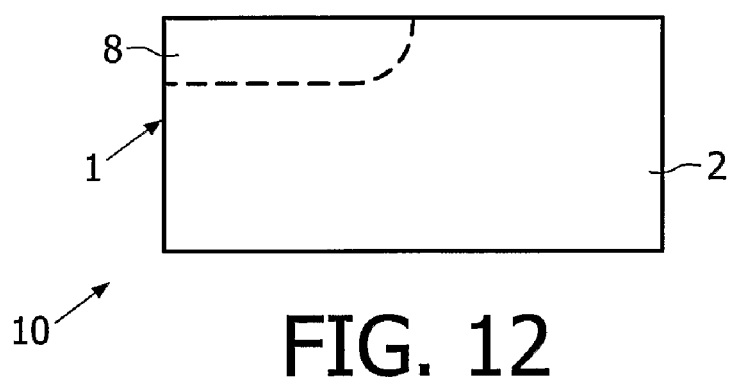
Figure 13:
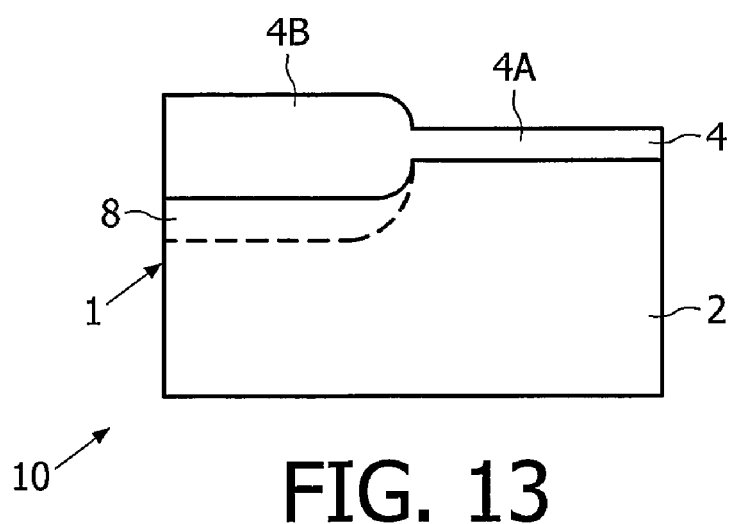

In the drawings:

FIGS. 1 through 9 are diagrammatic cross-sectional views, at right angles to the thickness direction, of a semiconductor device in accordance with the invention in successive stages of the manufacturing process by means of a first embodiment of a method in accordance with the invention, and FIGS. 10 through 13 are diagrammatic cross-sectional views, at right angles to the thickness direction, of a semiconductor device in accordance with the invention in successive stages of the manufacturing process by means of a second embodiment of a method in accordance with the invention.

The Figures are not drawn to scale and some dimensions, such as dimensions in the thickness direction, are exaggerated for clarity. Corresponding regions or parts in the different Figures are indicated by means of the same hatching or the same reference numerals, whenever possible.

FIGS. 1 through 9 are diagrammatic cross-sectional views, at right angles to the thickness direction, of a semiconductor device in successive stages of the manufacturing process by means of an embodiment of a method in accordance with the invention. The starting material used in the formation of the device 10 (see FIG. 1) is a semiconductor body 1 with a semiconductor substrate 2 which in this case comprises, for example a p-type, semiconductor substrate of silicon. A thermal oxide layer 4 having a thickness of 10 to 40 nm is formed thereon (see FIG. 2) by means of thermal oxidation and epitaxy. Subsequently, on said layer 4 (see FIG. 3), a silicon-nitride mask 7 is provided at the location of the first sub-layer to be formed of an electrically insulating layer 4. The mask may be formed by providing a silicon nitride layer throughout the surface, for example by means of CVD (=Chemical Vapor Deposition), which layer is subsequently patterned by means of photolithography and etching, for example with hot phosphoric acid.

Subsequently (see FIG. 4), another thermal oxidation process is carried out, whereby the thermal oxide layer 4 is locally (outside the mask 7) further increased in thickness to, for example, 40 to 200 nm. The mask 7 is subsequently removed. In a modification, the mask 7 is provided directly on the silicon surface, and the thinner thermal oxide is not formed until after the mask 7 has been removed.

Next (see FIG. 5), the surface of the semiconductor body 1 is planarized by means of chemical-mechanical polishing. As a result, the two sub-layers 4A, 4B are formed, the thickness of the first sub-layer 4A being smaller than that of the second sub-layer 4B, and the upper borders of both sub-layers 4A, 4B being at the same level, and the lower border of the second sub-layer 4B being recessed in the semiconductor body 1 in relation to the lower border of the first sub-layer 4A. At this stage, the thickness of the two sub-layers 4A, 4B is, for example, in the range of 5 to 20 nm and 20 to 100 nm, respectively.

Subsequently (see FIG. 6), a further semiconductor body 11 comprising a further semiconductor substrate 20 is provided near the semiconductor body 1. By subjecting the further semiconductor substrate to hydrogen or hydrogen and helium implantations, said further semiconductor substrate has been treated such that the plane 60 shown in FIG. 6 forms a plane along which the further semiconductor body 11 can readily be split. The part 30 of the further semiconductor body 11 adjoining the semiconductor body 1 is comparatively thin and will be used to form semiconductor region 3 of the device 10 in accordance with the invention.

Next (see FIG. 7), the further semiconductor body 11 is attached to the semiconductor body 1 by means of a substrate-bonding technique.

Subsequently (see FIG. 8), the part of the further semiconductor body 11 situated above the plane 60 is removed by means of splitting. As a result, the semiconductor region 3 is formed on the semiconductor body 1.

Next (see FIG. 9), semiconductor elements 5, 6 are formed in the semiconductor region 3 at the location of, respectively, the first and the second sub-layer 4A, 4B, by means of customary silicon technology. These semiconductor elements 5, 6, which are indicated by means of blocks for the sake of simplicity, are in reality, for example, a MOSFET or a bipolar transistor. In practice, large numbers of such elements are formed in both semiconductor sub-regions 3A, 3B. In addition, the drawing does not show that the thinner sub-layer 4A can be used, for example, as a gate dielectric of a so-termed dual-gate (MOS) transistor.

The manufacture of the device 10 is subsequently completed in that, if necessary, one or more active and/or passive elements, such as diodes, resistors, coils and capacitors are formed therein. A suitable pattern of connection conductors and/or bond pads is also formed, and individual semiconductor devices 10, which may comprise a discrete or semi-discrete device 10 or preferably an IC, are obtained by means of separation techniques such as dicing.

FIGS. 10 through 13 are diagrammatic cross-sectional views, at right angles to the thickness direction, of a semiconductor device in accordance with the invention in successive stages of the manufacturing process by means of a second embodiment of a method in accordance with the invention. In this modification, use is made of means capable of locally accelerating a thermal oxidation, whereas in the previous example use was made of means capable of locally delaying, or even precluding, a thermal oxidation. Also in this case, the starting material used (see FIG. 10) is a semiconductor body 1 comprising a p-type silicon semiconductor substrate.

On said semiconductor body (see FIG. 11), a mask 110 is locally formed which in this case comprises a photoresist which can be readily patterned by means of photolithography. Next, oxidation-accelerating impurities are locally introduced into the semiconductor body 1, in this case by means of an ion implantation 120. As a result, a region 8 is formed, in this case, which has a high concentration of such oxidation-accelerating impurities. In this example, arsenic ions are used for this purpose, and the region 8 contains a concentration of approximately $3 \times 10^{21}$ at/cm$^3$. The remainder of the semiconductor substrate has, for example, a doping concentration which is (much) lower than approximately $1 \times 10^{19}$ at/cm$^3$. Such a difference in concentration results, in the case of a thermal oxidation, in an increase of the oxidation rate by approximately a factor of 10 to 20. After the implantation process, a so-termed temper step may be carried out, if necessary.

Subsequently (see FIG. 12), the mask 110 is removed, after which (see FIG. 13) a thermal oxidation is carried out, thereby forming, like in the previous example, the two sub-layers 4A, 4B of the electrically insulating layer 4 in a thickness which is comparable, for example, to that of the previous example.

The method of this example is subsequently continued in the same way as the method of the previous example. Consequently, for the description thereof reference is made to the description of the previous example. The Figures associated with this part of the method are FIGS. 5 through 9.

The invention is not limited to the exemplary embodiment described hereinabove and, within the scope of the invention, many variations and modifications are possible to those skilled in the art. For example, differences in thickness between the two sub-layers can also be achieved by using a combination of oxidation-accelerating and oxidation-decelerating means.

It is further noted that also lateral isolation regions, such as STI (=Shallow Trench Isolation) or LOCOS (=Local Oxidation of Silicon) regions, are formed in the semiconductor region. In addition, the conductivity type does not have to be the same throughout the semiconductor region, or the conductivity type does not have to be the same as that of the part of the semiconductor body lying under the isolating layer.

It is noted that it is possible, within the scope of the invention, to use other materials than those used in the examples. It is also possible to use other deposition techniques for the above-mentioned or other materials, such as epitaxy, CVD (=Chemical Vapor Deposition), sputtering and vacuum evaporation. Instead of wet-chemical etch methods, use can alternatively be made of "dry" techniques, such as plasma etching, and conversely.

In addition it is noted that also combinations of the techniques used in the examples can be employed to form the two sub-layers. For example, the local use of oxidation-decelerating means and the use of oxidation-accelerating means can be combined at a different location.

It is further noted that the thinner sub-layer can alternatively be formed after the thicker sub-layer has been formed, and even after the semiconductor body has been subsequently planarized, in which case approximately half of the thicker sub-layer is removed again. Possibly, a very thin, thinner sub-layer and the associated gradual, small step in the surface does not present an obstacle in a substrate-transfer process. If necessary, a second, smaller/finer planarization step may be carried out subsequent to the formation of a very thin, thinner sub-layer after the local formation of a thick sub-layer and after a subsequent coarser planarization step, which step is carried out, however, prior to the formation of the thinner sub-layer.

Finally, it is noted that sub-layers recessed with respect to each other in the semiconductor body can alternatively be manufactured by means of oxygen implantations, such as, for example, in the manufacture of a SOI substrate. This, as well as the coplanarity of the upper sides of the two sub-layers, can be achieved by a suitable choice of implantation dosages and energies.

The invention claimed is:

1. A method of manufacturing a semiconductor device with a semiconductor body, the method comprising:
    forming a semiconductor substrate and a semiconductor region, which are separated from each other by an electrically insulating layer, said electrically insulating layer including a first and a second sub-layer which are adjacent when viewed in projection, wherein the first sub-layer has a smaller thickness than the second sub-layer;
    forming at least one digital semiconductor element in a first sub-region of the semiconductor region situated above the first sub-layer; and
    forming at least one analog semiconductor element in a second sub-region of the semiconductor region situated above the second sub-layer, characterized in that the second sub-layer is formed in such a manner that the lower border thereof is recessed in the semiconductor body in relation to the lower border of the first sub-layer;
    wherein the thickness of the semiconductor region at the location of the first and the second sub-layer is such that the digital and analog semiconductor elements operate in a fully depleted mode.

2. A method as claimed in claim 1, characterized in that the upper border of the first sub-layer in the semiconductor body is formed at the same level in the semiconductor body as the upper border of the second sub-layer.

3. A method as claimed in claim 1, characterized in that the first and the second sub-layer are formed at the surface of the semiconductor substrate, and the semiconductor region is provided thereon by means of a substrate-transfer technique.

4. A method as claimed in claim 3, characterized in that the first and the second sub-layer are formed by thermal oxidation of the surface of the semiconductor substrate, wherein thickness-regulating means are locally applied, causing the oxide thickness at the location of the first sub-layer to be formed to be smaller than that at the location of the second sub-layer to be formed, and, after the thermal oxidation process, the surface of the semiconductor body is planarized by means of chemical-mechanical polishing, after which the semiconductor region is provided thereon by means of the substrate-transfer technique.

5. A method as claimed in claim 4, characterized in that the thickness-regulating means comprise the application, at the location of the first sub-layer, of a mask which delays the oxidation process.

6. A method as claimed in claim 4, characterized in that the thickness-regulating means comprise providing the oxidation-accelerating impurities in the semiconductor substrate at the location of the second sub-layer.

7. A method as claimed in claim 4, characterized in that the semiconductor region is formed by treating a surface region of a further semiconductor substrate by means of hydrogen and helium, and after transfer of the further semiconductor substrate, whereby the surface region is provided on the planarized semiconductor substrate, the remaining part of the further semiconductor substrate is removed by means of a splitting technique.

8. A semiconductor device with a semiconductor body comprising:
 a semiconductor substrate and a semiconductor region, which are separated from each other by an electrically insulating layer, said electrically insulating layer including:
 a first and a second sub-layer which, viewed in projection, are adjoining layers;
 wherein the first sub-layer has a smaller thickness than the second sub-layer;
 at least one digital semiconductor element disposed in a first sub-region of the semiconductor region situated above the first sub-layer, and;
 at least one analog semiconductor element disposed in a second sub-region of the semiconductor region situated above the second sub-layer;
 wherein the lower border of the second sub-layer is recessed in the semiconductor body in relation to the lower border of the first sub-layer; and
 wherein the thickness of the semiconductor region at the location of the first and the second sub-layer is such that the digital and analog semiconductor elements operate in a fully depleted mode.

9. A semiconductor device claimed in claim 8, characterized in that the upper border of the first sub-layer is formed at the same level in the semiconductor body as the upper border of the second sub-layer.

10. A method as claimed in claim 1, wherein the step of forming the semiconductor substrate and the semiconductor region, which are separated from each other by the electrically insulating layer, includes:
 forming a thermal oxide layer on the semiconductor substrate;
 providing a mask on said thermal oxide layer above a first region of the thermal oxide layer; and
 using a thermal oxidation process to increase the thickness of a portion of the thermal oxide layer at a second region of the thermal oxide layer;
 wherein the first sub-layer is formed at said first region and the second sub-layer is formed at said second region.

* * * * *